United States Patent
Onishi et al.

(10) Patent No.: US 6,333,267 B1
(45) Date of Patent: *Dec. 25, 2001

(54) METHOD OF MANUFACTURING ACTIVE MATRIX TYPE LIQUID CRYSTAL DISPLAY

(75) Inventors: Takashi Onishi; Eiji Iwamura; Seigo Yamamoto; Katsutoshi Takagi; Kazuo Yoshikawa, all of Kobe (JP)

(73) Assignee: Kabushiki Kaisha Kobe Seiko Sho, Kobe (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/400,861

(22) Filed: Mar. 8, 1995

(30) Foreign Application Priority Data

Jun. 30, 1994 (JP) .................................... 6-150024

(51) Int. Cl.[7] .......................... H01L 21/285; C23C 14/34
(52) U.S. Cl. ......................... 438/688; 438/660; 438/30; 174/250; 174/257
(58) Field of Search .................... 174/250, 255, 174/256, 257; 437/187; 438/30, 688, 660, 669

(56) References Cited

U.S. PATENT DOCUMENTS 5,296,653 * 3/1994 Kiyota et al. .................... 174/250

FOREIGN PATENT DOCUMENTS 6-333926 * 12/1994 (JP) .
7-45555 * 2/1995 (JP) .

OTHER PUBLICATIONS

Joshi et al., "Aluminum—Samarium Alloy for Interconnections in Integrated Circuits," J. Vac. Sci. Technol. A, vol. 8, No. 3, May/Jun. 1990, pp. 1480–1483.*

Lee et al., "Annealing Behavior of Al–Y Alloy Film for Interconnection Conductor in Microelectronic Devices", J. Vac. Sci. Technol. B, vol. 9, No. 5, Sep./Oct. 1991, pp. 2542–2547.*

* cited by examiner

Primary Examiner—Mary Wilczewski
(74) Attorney, Agent, or Firm—Oblon, Spivak, McClelland, Maier & Neustadt, P.C.

(57) ABSTRACT

An active matrix type liquid crystal display, in which the reliability is enhanced by preventing the short-circuit and insulation breakdown of a gate insulating portion and the delay time of a gate bus line is shortened by reducing the resistivity of an interconnect film. The liquid crystal display of this type is manufactured by the steps of forming an interconnect/electrode film on a substrate by physical deposition; patterning the interconnect/electrode film; and anodic-oxidizing part or all of the interconnect/electrode film. In this method, the interconnect/electrode film is formed of an Al alloy containing at least one kind selected from a group consisting Fe, Co and rare earth elements in an amount of 0.1 to 10 at %; and the thickness of the anodic oxidation film is specified to be in the range of 200 Å or more.

3 Claims, 3 Drawing Sheets

METHOD OF MANUFACTURING ACTIVE MATRIX TYPE LIQUID CRYSTAL DISPLAY

BACKGROUND OF THE INVENTION

1. Field of the Invention

The present invention relates to a method of manufacturing an active matrix type liquid crystal display, and particularly to a method of forming interconnect films such as a lower electrode/interconnect film, gate electrode film, scanning electrode/interconnect film, and data signal row electrode/interconnect film.

2. Description of the Related Art

A Liquid crystal display (hereinafter, referred to as LCD) is advantageous to be thinned more than conventional cathode-ray tubes and has a possibility of obtaining a high resolution image, and in recent years, it has been extensively used. The LCD is classified into an active matrix type and a simple matrix type. The former has a structure in which a switching element of two or three-terminals is incorporated in each pixel; and the latter has not such a structure. Conventionally, the latter has been mainly used; however, in recent years, to achieve high resolution image and to increase the size, the active matrix type LCD has come to be widely used.

The above-described switching elements have been variously proposed. However, there has been a trend in the needs and in the development toward a large sized color liquid crystal panel, and a TFT (Thin Film Transistor) having three-terminals has come to be widely used as the switching element because of the merit in obtaining a high gradation required for full-coloring.

As shown in FIG. 3, the TFT is a field effect type transistor having a structure in which a gate electrode 4, a gate insulating film 5, a semiconductor film 6 and a source/drain electrode 7 are sequentially layered. The gate insulating film 5 is commonly made of $SiN_x$, and it requires the reliability in the interlayer insulation. To ensure such reliability, the gate insulating film 5 must be less in pin-hole and is densified. However, in the above $SiN_x$, the pin-hole is difficult to be perfectly removed, and local defects due to refuse upon film formation are often generated. On the other hand, the gate insulating film 5 serves as the interlayer insulating film at the portion where a signal interconnect film intersects a gate interconnect film, and it particularly requires the reliability in the insulation. In view of the foregoing, as shown in FIG. 4, the gate electrode 4 made of Ta, Al, MoTa or the like is anodic-oxidized, to form an anodic oxidation film 4f, and a $SiN_x$ film 8 is layered thereon. Thus, the layer composed of the anodic oxidation film 4f and the $SiN_x$ film 8 is used as the gate insulating film 5. Namely, the gate insulating film 5 having a double structure composed of the lower portion of the anodic oxidation film 4f and the upper portion of the $SiN_x$ film 8 has come to be been mainly used. The anodic oxidation film 4f is commonly made of $Ta_2O_5$ or $Al_2O_3$ in terms of the withstand voltage, strength and structural homogeneity (pin hole free). The layer 9 composed of the gate electrode 4 and the anodic oxidation film 4f is called a gate interconnect film.

In the active matrix type liquid crystal display (hereinafter, referred to as AMLCD) using a TFT, the anodic oxidation film 4f is made of $Ta_2O_5$ or $Al_2O_3$, as described above, and thereby the gate electrode 4 is made of Ta or Al. In this case, the use of Ta and Al brings about the following advantages and problems.

In the former, the $Ta_2O_5$ film has a high dielectric constant and a high withstand voltage, and further it is excellent in smoothness leading to the precise control of the film thickness. However, in the case where the Ta film of the gate electrode 4 serves as the scanning electrode interconnect film, there occurs a problem in increasing the delay time of a gate bus line because of a large resistivity, as a result of which the Ta film cannot be used for a large size LCD.

In the latter, since Al has a low resistivity, it is effective for preventing the delay time of a gate bus line. However, the $Al_2O_3$ film is inferior in the withstand voltage to the $Ta_2O_5$ film, and has a difficulty in controlling the film quality upon anodic oxidation. Consequently, the use of the Al film as an interconnect film or an electrode film of the TFT-LCD causes a problem in reducing the reliability of the TFT, that is, of the AMLCD resulting in the poor yield.

A technique for improving the anodic oxidation characteristic (withstand voltage of anodic oxidation film) of the Al film has been proposed in Unexamined Japanese Patent Publication Nos. HEI 5-297389 and HEI 5-341315, wherein the Al film is added with Ti and Ta in specified amounts. As compared with the pure Al interconnect/electrode film, the Al alloy interconnect/electrode film is excellent in the anodic oxidation characteristic, and thereby it has a high withstand voltage. However, the Al alloy interconnect/electrode film is insufficient in the withstand voltage compared with the pure Ta interconnect/electrode film, and is required to be further improved in the anodic oxidation characteristic. On the other hand, in the Al alloy film added with alloy elements such as Ti and Ta, the resistivity is increased linearly with the added amount, and accordingly, it is not optimized from the viewpoint of shortening of the delay time of a gate bus line.

SUMMARY OF THE INVENTION

An object of the present invention is to solve the problems in the prior art and to provide a method of a manufacturing an AMLCD capable of enhancing the reliability of an element by preventing the short-circuit and dielectric breakdown of a gate insulating film portion and of shortening the delay time of a gate bus line by reducing the resistivity.

To achieve the above object, according to the present invention, there is provide a method of manufacturing an active matrix type liquid crystal display having an interconnect film and a switching element, comprising:

a process of forming an interconnect/electrode film on a substrate by physical deposition;

a process of patterning the interconnect/electrode film; and a process of anodic-oxidizing part or all of the interconnect/electrode film;

wherein the interconnect/electrode film is formed of an Al alloy containing at least one kind selected from a group consisting Fe, Co and rare earth elements in an amount of 0.1 to 10 at %; and the thickness of the anodic oxidation film is specified to be in the range of 200 Å or more.

DETAILED DESCRIPTION OF THE PREFERRED EMBODIMENTS

A method of an AMLCD having an interconnect film and a switching element according to the present invention includes a process (1) of forming an interconnect/electrode film, a process (2) of patterning the interconnect/electrode film, and a process (3) of anodic-oxidizing the interconnect/electrode film. In the process (1), there is formed an interconnect/electrode film made of an Al alloy containing at least one kind selected from a group consisting of Fe, Co, and rare earth elements in an amount of 0.1 to 10 at %. In the process (3), an anodic oxidation film having a thickness of 200 Å or more is formed on the surface of the interconnect/electrode film. Accordingly, by the following functional effect due to the combination of the composition of the material and the anodic oxidation film, there can be manufactured an AMLCD in which the reliability is enhanced by preventing the short-circuit and insulation breakdown of a gate insulating portion and the delay time of a gate bus line is shortened by reducing the resistivity of the interconnect film. In addition, the rare earth elements used may include a lanthanide elements such as Y, La, Nd, Gd, Dy, Tb, Ce, Pr, Pm, Sm, and Eu and actinide elements such as Ac, Th, Pa, Am, and Cm.

Figure 1:
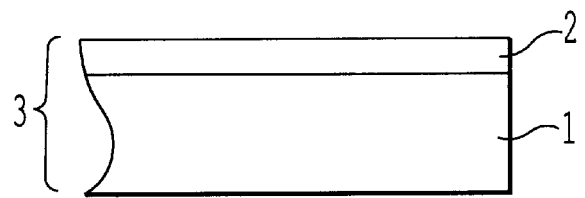
FIG. 1 is a schematic side sectional view of an interconnect film of the present invention, which is composed of a backing Al alloy film and an anodic oxidation film formed on the surface of the Al alloy film.
Figure 2:
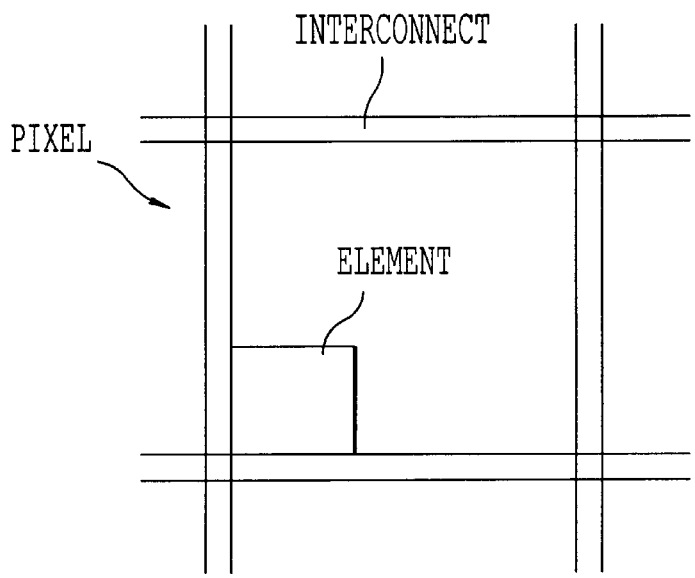
FIG. 2 is a view for explaining a pixel and an element in a liquid crystal panel of an active matrix type liquid crystal display.
Figure 3:
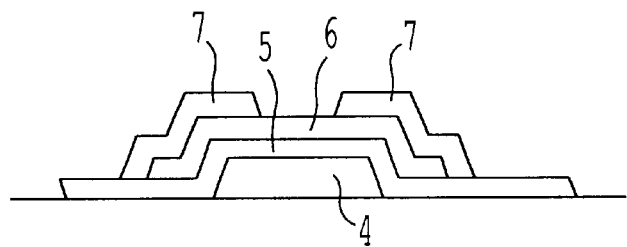
FIG. 3 is a schematic side sectional view of a TFT having three-terminals.
Figure 4:
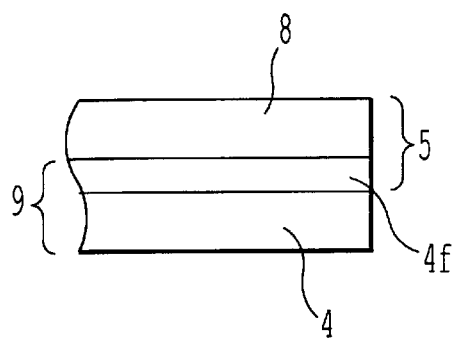
FIG. 4 is a schematic side sectional view of a gate insulating film having a double structure composed of a lower portion formed of an anodic oxidation film by anodic oxidation of a gate electrode and an upper portion formed of a SiN film.

According to the present invention, as shown in FIG. 1, there is formed an interconnect/electrode film 3 composed of a backing alloy film 1 made of an Al alloy and an anodic oxidation film 2 having a thickness of 200 Å or more formed on the surface of the backing alloy film 1. The backing film 1 of the present invention, as described later, has a resistivity (20 $\mu\Omega$cm or less) lower than that of an Al—Ti alloy film or an Al—Ta alloy film, and accordingly, it realizes the shortening of the delay time of a gate bus line. The $Al_2O_3$ film obtained by anodic oxidation of the backing alloy film 1 is superior in withstand voltage to the $Al_2O_3$ film obtained by anodic oxidation of the Al—Ti or Al—Ta alloy film.

Accordingly, by use of the interconnect/electrode film of the present invention as a gate interconnect film 9 (gate electrode 4/anodic oxidation film 4f), a scanning interconnect film or a data signal row interconnect film of a TFT of an AMLCD, the reliability is enhanced by preventing the short-circuit and insulation breakdown of a gate insulating film portion, and the delay time of a gate bus line is shortened by reducing the resistivity of the interconnect film. As a result, there can be manufactured a large sized LCD excellent in reliability, which for example realizes the highly precise coloring over a large screen of 10 inch or more.

The content of alloy elements in the interconnect/electrode film of the present invention is specified to be in the range of from 0.1 to 10 at %. When it is less than 0.1 at %, the effect of enhancing the anodic oxidation characteristic is insufficient, and an anodic oxidation film having a high withstand voltage and an excellent smoothness cannot be obtained. On the other hand, when it is more than 10 at %, the resistivity exceeds 20 $\mu\Omega$cm after heat-treatment, the effect of shortening the delay time of a gate bus line cannot be achieved. The content of alloy elements is preferably in the range of from 1 to 5 at %.

In the present invention, the thickness of the anodic oxidation film is specified to be 200 Å or more. When it is less than 200 Å, the withstand voltage is insufficient, and the AMLCD obtained is poor in reliability. The thickness is preferably in the range of 500 Å or more.

In formation of the above-described interconnect film by sputtering, it is desirable to use a sputtering target made of an Al alloy manufactured by melting/casting or powder sintering (hereinafter, referred to as a melting alloy target). The melting alloy target is homogeneous in the composition and is also uniform in the sputter yield and in ejecting angle, and thereby it is capable of forming a homogeneous interconnect/electrode film excellent in reliability. In particular, the target manufactured by melting/casting can be limited in the content of oxygen in the range of 100 ppm or less. This makes it possible to easily keep constant the film deposition rate, and to reduce the electrical resistance of the interconnect film and improve the corrosion resistance because of the limited content of oxygen in the interconnect film.

The above-described patterning is not particularly limited, and may be performed, for example by photolithography and wet etching or dry etching.

The present invention is not limited to a method of manufacturing an active matrix type liquid crystal display, but may be applied to a method of manufacturing a simple matrix type liquid crystal display by use of the principle of the present invention for formation of an interconnect film.

The present invention will be more clearly understood by way of the following examples.

EXAMPLE 1

An Al alloy film having a composition containing each of Fe, Co, Y, La, Nd, Gd, Dy and Tb in an amount of 2 at % was formed on a glass substrate to a thickness of 5000 Å by sputtering. The resultant film was subjected to photolithography and wet etching, to thus form a comb-like electrode having a stripe pattern with a width of 100 $\mu$m. The electrode thus obtained was taken as an operational electrode, and a Pt mesh electrode was taken as the opposed electrode. On the other hand, an electrolytic bath was prepared by mixing 3% tartaric acid solution with ethylene glycol in equal amounts, and further adding aqueous ammonia to the mixed solution at the concentration of pH=7.0±0.5. The above electrode was dipped in the electrolytic bath, and was anodic-oxidized by constant voltage electrolysis at a voltage of 72 V and at a bath temperature of 25° C., thus forming an anodic oxidation film. The thickness of the anodic oxidation film thus obtained was 1500 Å for each Al alloy film.

After anodic oxidation, the comb-like electrode thus obtained was formed with a pure Al film to a thickness of 5,000 Å by sputtering, and was formed with a stripe pattern with a width of 100 $\mu$m in the direction perpendicular to the stripe pattern of the comb-electrode by photolithography and wet etching, thus forming a sample.

The orthogonal interconnect pattern of the above sample was contacted with a probe, and was measured a voltage leading to the dielectric breakdown by gradually applying a voltage.

Next, samples (Comparative Examples) for measuring the withstand voltage were prepared in the same manner as described above, except that the backing comb-electrodes were formed of a pure Al film and an Al alloy film having a composition containing each of Si and Ta in an amount of 2 at %.

The result of measuring the withstand voltage of the anodic oxidation film formed on each Al alloy film is shown in Table 1.

TABLE 1

| Kind of alloy | Average value of dielectric breakdown voltage (V) | Remark |
|---|---|---|
| Pure Al | 32.5 | Comparative |
| Al-2at % Si | 15.0 | example |
| Al-2at % Ta | 48.3 | |
| Al-2at % Fe | 50.7 | Inventive |
| Al-2at % Co | 49.3 | example |
| Al-2at % Y | 60.5 | |
| Al-2at % La | 65.2 | |
| Al-2at % Nd | 84.0 | |
| Al-2at % Gd | 57.9 | |
| Al-2at % Dy | 84.7 | |
| Al-2at % Tb | 66.3 | |

As is apparent from Table 1, the withstand voltage of the anodic oxidation film formed on the Al alloy film added with Si (Comparative Example) was significantly lower than that of the anodic oxidation film formed on the pure Al, film. On the contrary, the withstand voltage of the anodic oxidation film of the Al alloy film added with Ta (Comparative Example) was higher than that of the anodic oxidation film formed on the pure Al film.

On the other hand, the withstand voltage of the anodic oxidation film formed on the Al alloy film added with each of Fe, Co, Y, Nd, Gd, Dy and Tb (Inventive Example) was equal to or higher than that of the anodic oxidation film formed on the Al alloy film added with Ta.

As a result, it was revealed that the Al alloy film added with each of Fe, Co, Y, La, Nd, Gd, Dy and Tb was excellent in the anodic oxidation characteristic.

EXAMPLE 2

The sample for measuring the withstand voltage was prepared in the same manner as in Example 1 using a backing comb-like electrode of an Al alloy film added with Nd (the content thereof is changed) formed on a glass substrate. As Comparative Example, the sample for measuring the withstand voltage was prepared in the same manner as described above using a backing comb-like electrode of an Al alloy added with Ta in a specified amount. Each of the samples thus obtained was measured for the withstand voltage.

Figure 5:
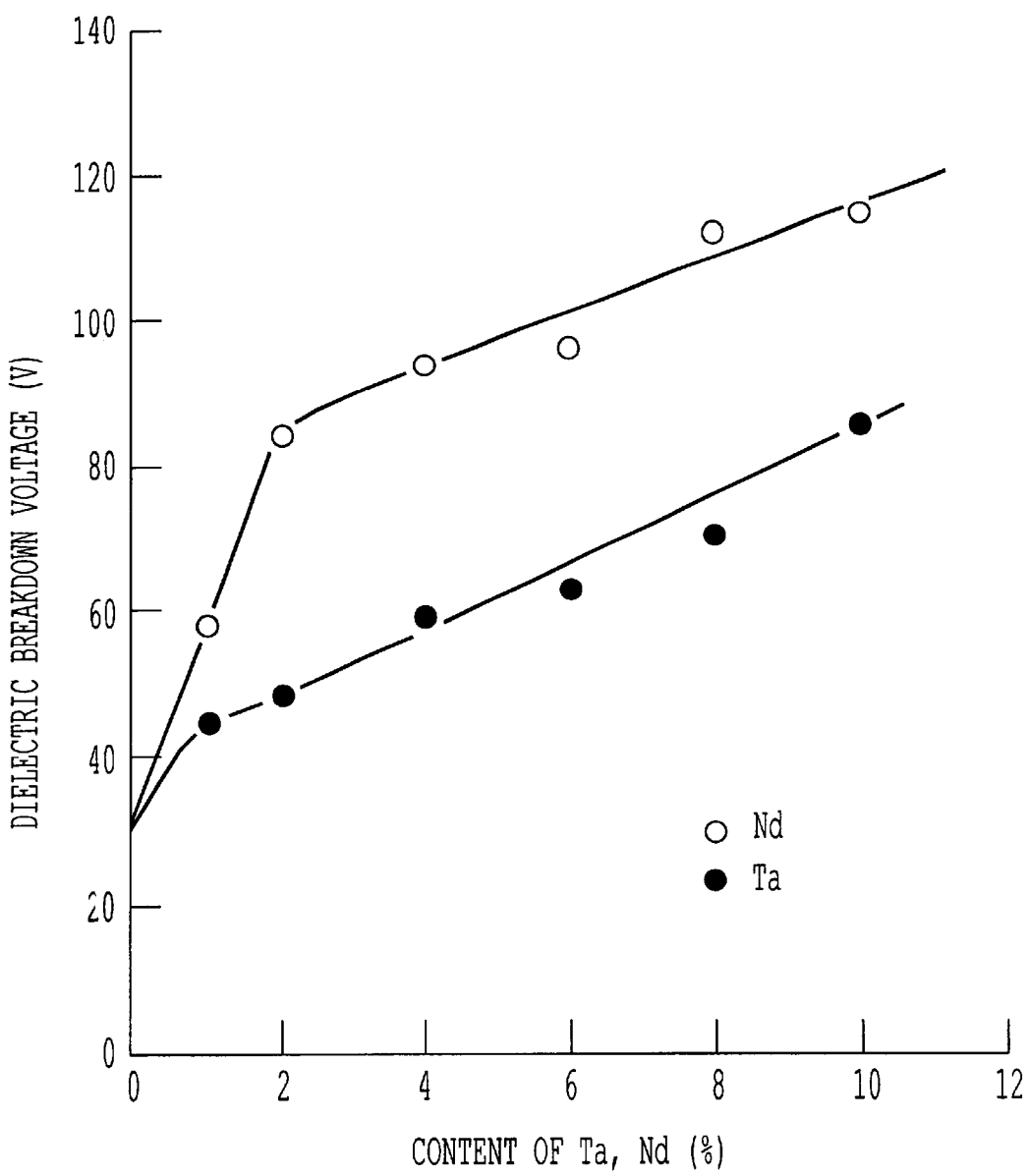
FIG. 5 is a characteristic graph showing the relationship between the content of each of Nd and Ta in an Al film and dielectric breakdown voltage.

FIG. 5 shows the relationship between the content of each of Nd and Ta in the Al film and the withstand voltage. The withstand voltage is increased linearly with the content of each of Nd and Ta. However, when the content of each of Nd and Ta is more than 2 at %, the withstand voltage tends to be saturated. For the same content, as compared with the anodic oxidation film formed on the Al—Ta alloy film, the anodic oxidation film formed on the Al—Nd alloy film (Inventive Example) is higher in the withstand voltage and thereby it is higher in the anodic oxidation characteristic.

EXAMPLE 3

The sample for measuring the withstand voltage was prepared using an Al alloy film added with Nd in an amount of 2 at % in the same manner as in Example 2, except that the thickness of the anodic oxidation film was changed by changing the electrolytic voltage upon constant voltage electrolysis in the range of from 20 to 120 V. Each of the samples thus obtained was measured for the withstand voltage in the same manner as in Example 1.

Figure 6:
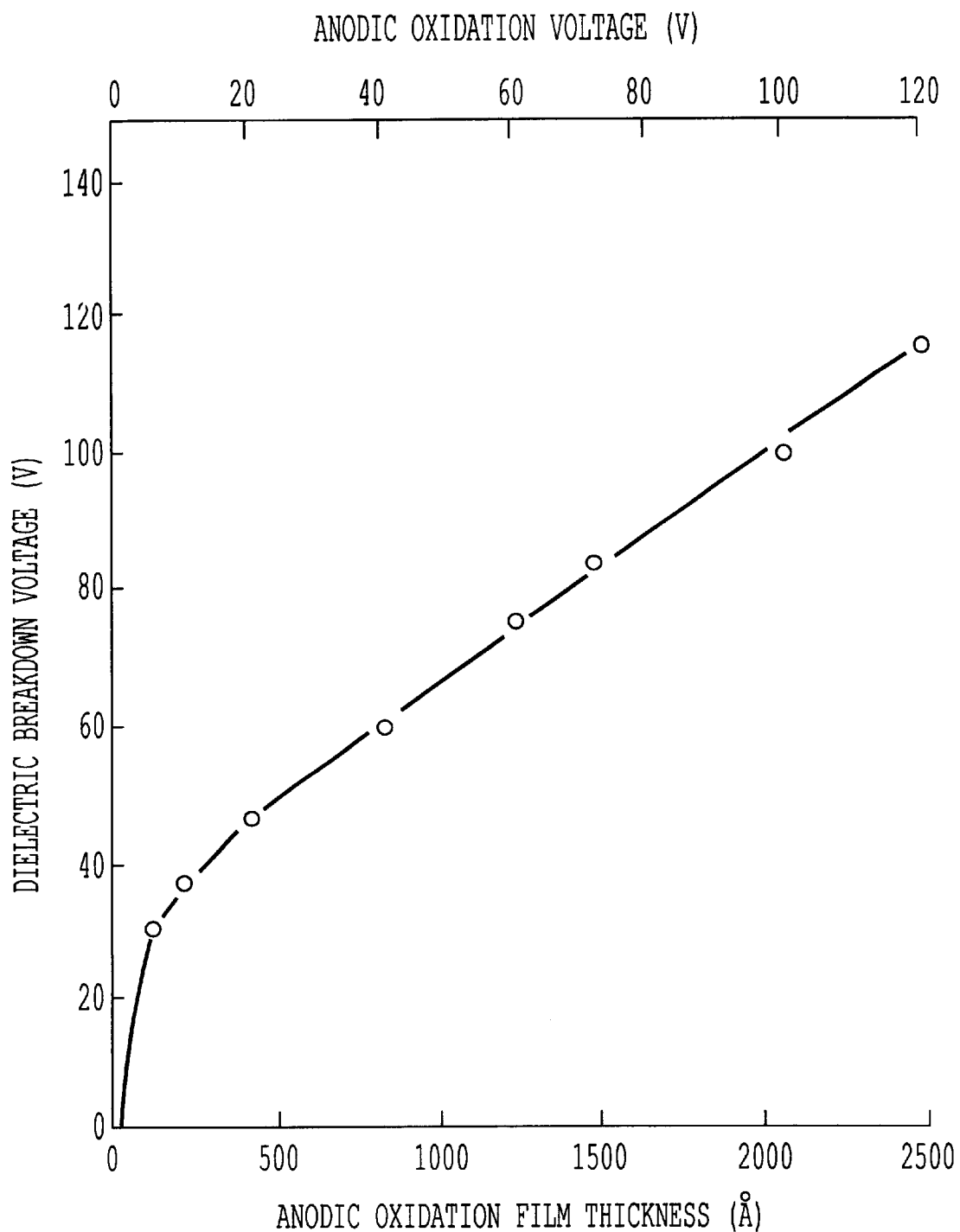
FIG. 6 is a characteristic graph showing the relationship between the thickness of an anodic oxidation film and the dielectric breakdown voltage.

FIG. 6 shows the relationship between the thickness of the anodic oxidation film and the withstand voltage for each sample. The withstand voltage is increased substantially linearly with the thickness of the anodic oxidation film. To obtain the practically usable withstand voltage, the film thickness is required to be in the range of 200 Å or more.

EXAMPLE 4

An Al alloy film added with each of Fe, Co, Y, La, Nd, Gd, Dy and Tb in an amount of 2 at % was formed on a glass substrate to a thickness of 3000 Å by sputtering, and was patterned in a specified pattern by photolithography and wet etching. Each of the samples thus obtained was measured for the resistivity of the film by a four-probe method.

The sample (Comparative Example) was prepared in the same manner as described above, using an Al alloy film added with Ta in an amount of 2 at %, and was measured for resistivity of the film.

Each of the films was then heat-treated in vacuum at 400° C. for 1 hr, and was measured for the resistivity of the film.

The results are shown in Table 2.

TABLE 2

| Kind of alloy | Resistivity directly after film formation | Resistivity after heat-treatment | Remark |
|---|---|---|---|
| Al-2at % Ta | 22.4 $\mu\Omega$cm | 10.3 $\mu\Omega$cm | Comparative example |
| Al-2at % Fe | 16.9 $\mu\Omega$cm | 4.7 $\mu\Omega$cm | Inventive example |
| Al-2at % Co | 13.2 $\mu\Omega$cm | 3.9 $\mu\Omega$cm | |
| Al-2at % Y | 14.1 $\mu\Omega$cm | 4.2 $\mu\Omega$cm | |
| Al-2at % La | 13.5 $\mu\Omega$cm | 4.0 $\mu\Omega$cm | |
| Al-2at % Nd | 13.5 $\mu\Omega$cm | 4.1 $\mu\Omega$cm | |
| Al-2at % Gd | 13.1 $\mu\Omega$cm | 4.6 $\mu\Omega$cm | |
| Al-2at % Dy | 13.9 $\mu\Omega$cm | 4.0 $\mu\Omega$cm | |
| Al-2at % Tb | 11.9 $\mu\Omega$cm | 4.1 $\mu\Omega$cm | |

The resistivity directly after sputtering and before heat-treatment is 20 $\mu\Omega$cm or more for the Al—Ta alloy film; and it is less than 20 $\mu\Omega$cm or less for each of the Al—Fe, Al—Co, Al—Y, Al—La, Al—Nd, Al—Gd, Al—Dy and Al—Tb alloy films. Accordingly, the Al alloy interconnect film containing each of Fe, Co, Y. La, Nd, Gd, Dy and Tb according to the present invention can realize the resistivity lower than that of the Al—Ta alloy interconnect film, and particularly, after the heat-treatment performed at 400° C. for 1 hr, it has an extremely low resistivity of 5 $\mu\Omega$cm or less.

What is claimed is:

1. A method of manufacturing an active matrix liquid crystal display having an interconnect film and a switching element, comprising:

forming an interconnect/electrode film on a substrate by physical vapor deposition;

patterning the interconnect/electrode film; and anodic-oxidizing part or all of the interconnect/electrode film to form an anodic oxidation film; wherein the interconnect/electrode film is formed of an Al alloy containing at least one element selected from the group consisting of Nd and Dy in an amount of 0.1 to 10 at %; and the thickness of the anodic oxidation film is in the range of 200 Å or more.

2. The method as claimed in claim 1, wherein the at least one element is present in an amount of from 1 to 5 at %.

3. The method as claimed in claim 1, wherein the thickness of the anodic oxidation film is in the ran of 500 Å or more.

* * * * *